(12) United States Patent
Johnson et al.

(10) Patent No.: US 6,361,675 B1
(45) Date of Patent: Mar. 26, 2002

(54) METHOD OF MANUFACTURING A SEMICONDUCTOR COMPONENT AND PLATING TOOL THEREFOR

(75) Inventors: Timothy Lee Johnson; Joseph English, both of Tempe; David Austin, Phoenix; George F. Carney, Mesa; Kandis Mae Knoblauch, Gilbert; Douglas G. Mitchell, Tempe, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/451,552

(22) Filed: Dec. 1, 1999

(51) Int. Cl.[7] .............................. C25D 5/02; C25D 5/10
(52) U.S. Cl. ..................................... 205/123; 205/170
(58) Field of Search ................... 205/123, 125, 205/170, 191

(56) References Cited

U.S. PATENT DOCUMENTS

| | | | |
|---|---|---|---|
| 5,358,621 A | * 10/1994 | Oyama | 205/123 |
| 5,407,557 A | * 4/1995 | Iida et al. | 205/125 |
| 5,429,733 A | 7/1995 | Ishida | 204/224 |
| 5,447,615 A | * 9/1995 | Ishida | 204/224 R |
| 6,099,712 A | * 8/2000 | Ritzdorf et al. | 205/123 |

* cited by examiner

*Primary Examiner*—Kathryn Gorgos
*Assistant Examiner*—Erica Smith-Hicks
(74) *Attorney, Agent, or Firm*—A. Kate Huffman; Patricia S. Goddard

(57) ABSTRACT

A method of manufacturing a semiconductor component includes depositing a first electrically conductive layer (675) over a substrate (270), forming a patterned plating mask (673) over the first electrically conductive layer, coupling a first plating electrode (250) to the first electrically conductive layer without puncturing the plating mask, and plating a second electrically conductive layer onto portions of the first electrically conductive layer. A plating tool for the manufacturing method includes an inner weir (220) located within an outer weir (210), an elastic member (230) over a rim (211) of the outer weir, a pressure ring (240) located over the rim of the outer weir and the elastic member, and a plurality of cathode contacts (250, 251, 252, 253) located between the pressure ring and the outer weir. The substrate is positioned between the elastic member and the pressure ring.

11 Claims, 5 Drawing Sheets

200

200

US 6,361,675 B1

METHOD OF MANUFACTURING A SEMICONDUCTOR COMPONENT AND PLATING TOOL THEREFOR

FIELD OF THE INVENTION

This invention relates, in general, to methods of manufacturing semiconductor components, and more particularly, to plating metal layers and plating tools therefor.

BACKGROUND OF THE INVENTION

The manufacturing of semiconductor components typically includes the plating of metal layers over a semiconductor substrate. However, plating processes have many problems. For example, the plating of a front surface of a semiconductor substrate typically also results in the undesired plating of the edge and back surfaces of the semiconductor substrate, and this undesired plating must be removed. The removal of the undesired plating requires several extra processing steps and increases the cost and duration of the manufacturing process. The extra steps also increase the probability of substrate breakage. Furthermore, the plating techniques also suffer from poor process control. For example, the thickness of the plated metal layer typically varies substantially across the semiconductor substrate, and it is also difficult to determine precisely when the plated metal layer has its desired thickness and when the plating process should be terminated. One reason for the poor process control is the use of cathode contacts to puncture through a photoresist layer to contact a metal seed layer.

Accordingly, a need exists for a method of manufacturing a semiconductor component that uses a plating technique eliminating or at least substantially reducing the undesired plating of the edge and back surfaces of the semiconductor substrate. It is desired for the plating technique to also have adequate process control. Furthermore, to achieve the desired manufacturing method, a need also exists for a plating tool that prevents or at least reduces plating on the edge and back surfaces of a semiconductor substrate and that enables adequate process control.

BRIEF DESCRIPTION OF THE DRAWINGS

The present invention will be better understood from a reading of the following detailed description, taken in conjunction with the accompanying drawing figures in which.

Figure 1:
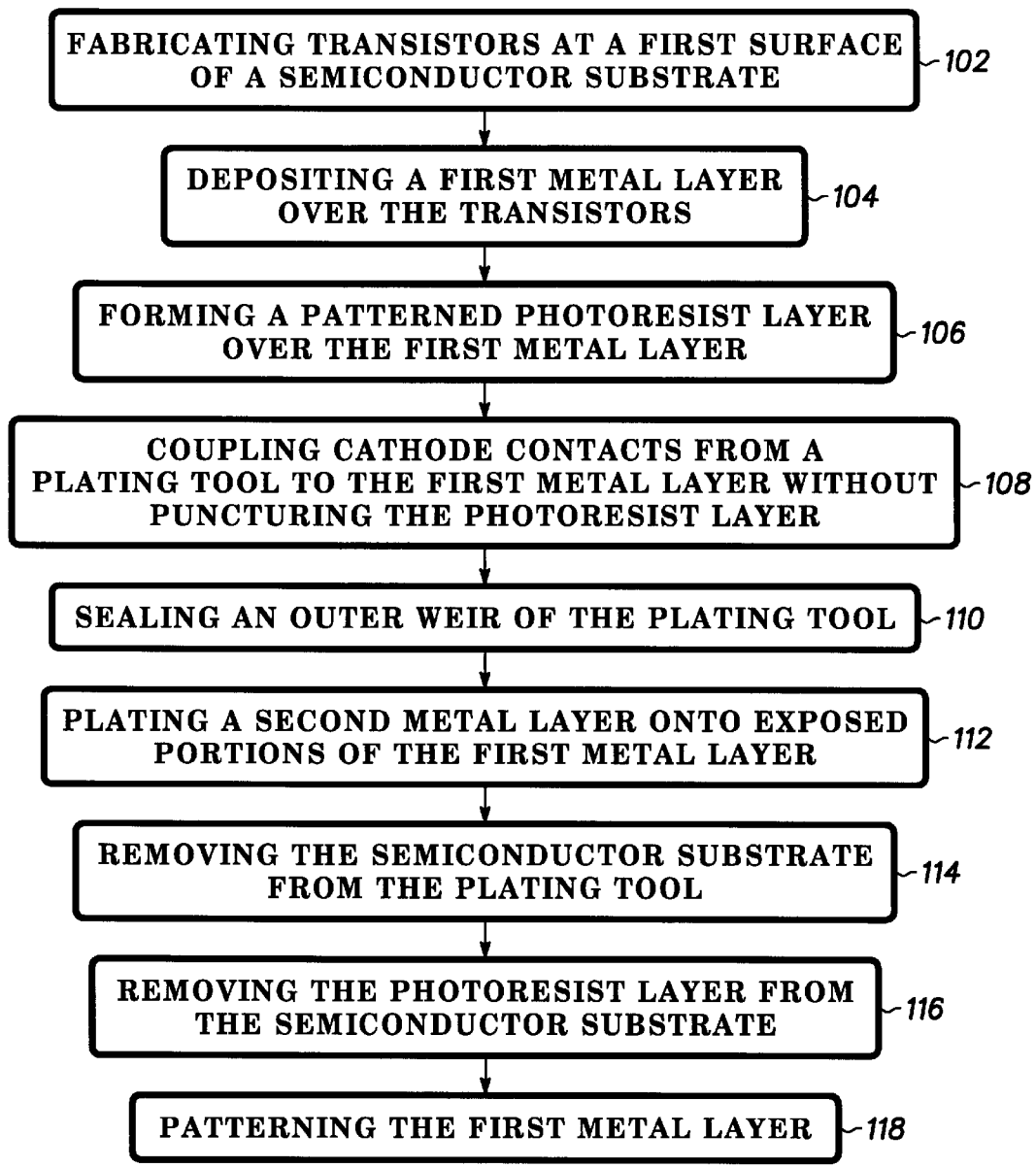
FIG. 1 outlines a method of manufacturing a semiconductor component in accordance with the present invention.

For simplicity and clarity of illustration, the drawing figures illustrate the general manner of construction, and elements in the drawing figures are not necessarily drawn to scale. Additionally, the same reference numerals in different figures denote the same elements, and descriptions and details of well-known features and techniques are omitted to avoid unnecessarily obscuring the present invention. Furthermore, the terms left, right, front, back, top, bottom, over, under, and the like in the description and in the claims, if any, are used for descriptive purposes. However, it is understood that the embodiment of the invention described herein is capable of operation in other orientations than described or illustrated herein. It is further understood that the terms so used are for the purposes of describing relative positions and are interchangeable under appropriate circumstances.

DETAILED DESCRIPTION OF THE DRAWINGS

FIG. 1 outlines a method 100 of manufacturing a semiconductor component. A semiconductor substrate is provided to have a first surface, a second surface opposite the first surface, and a side surface located between and coupling together the first and second surfaces. At a step 102, a plurality of transistors are fabricated at the first surface of the semiconductor substrate. At a step 104, a first electrically conductive layer is deposited over the plurality of transistors and the first surface of the semiconductor substrate. In the preferred embodiment, the first electrically conductive layer is a metal seed layer. At a step 106, a plating mask is formed over the first electrically conductive layer. The plating mask has holes or openings defining a pattern in the plating mask and exposing portions of the underlying electrically conductive layer. In the preferred embodiment, the plating mask is a photoresist layer.

At a step 108, cathode contacts from a plating tool are coupled or attached to the first electrically conductive layer without puncturing the photoresist layer, and at a step 110, the semiconductor substrate and an elastic member are used to seal an outer weir of a plating tool. The sequence of steps 108 and 110 can be reversed, or steps 108 and 110 can occur simultaneously. At a step 112, a second electrically conductive layer is plated onto the exposed portions of the first electrically conductive layer. In the preferred embodiment, the second electrically conductive layer is a metal layer, and the plating step occurs while the outer weir of the plating tool remains sealed. Furthermore, the plating process of step 112 is preferably performed without plating over the other surfaces of the semiconductor substrate. Additional details of steps 108, 110, and 112 are explained hereinafter.

Next, at a step 114, the semiconductor substrate is removed from the plating tool. At a step 116, the photoresist layer is removed from the semiconductor substrate after removing the semiconductor substrate from the plating tool, and at a step 118, the first electrically conductive layer is patterned after removing the photoresist layer from the semiconductor substrate.

Figure 2:
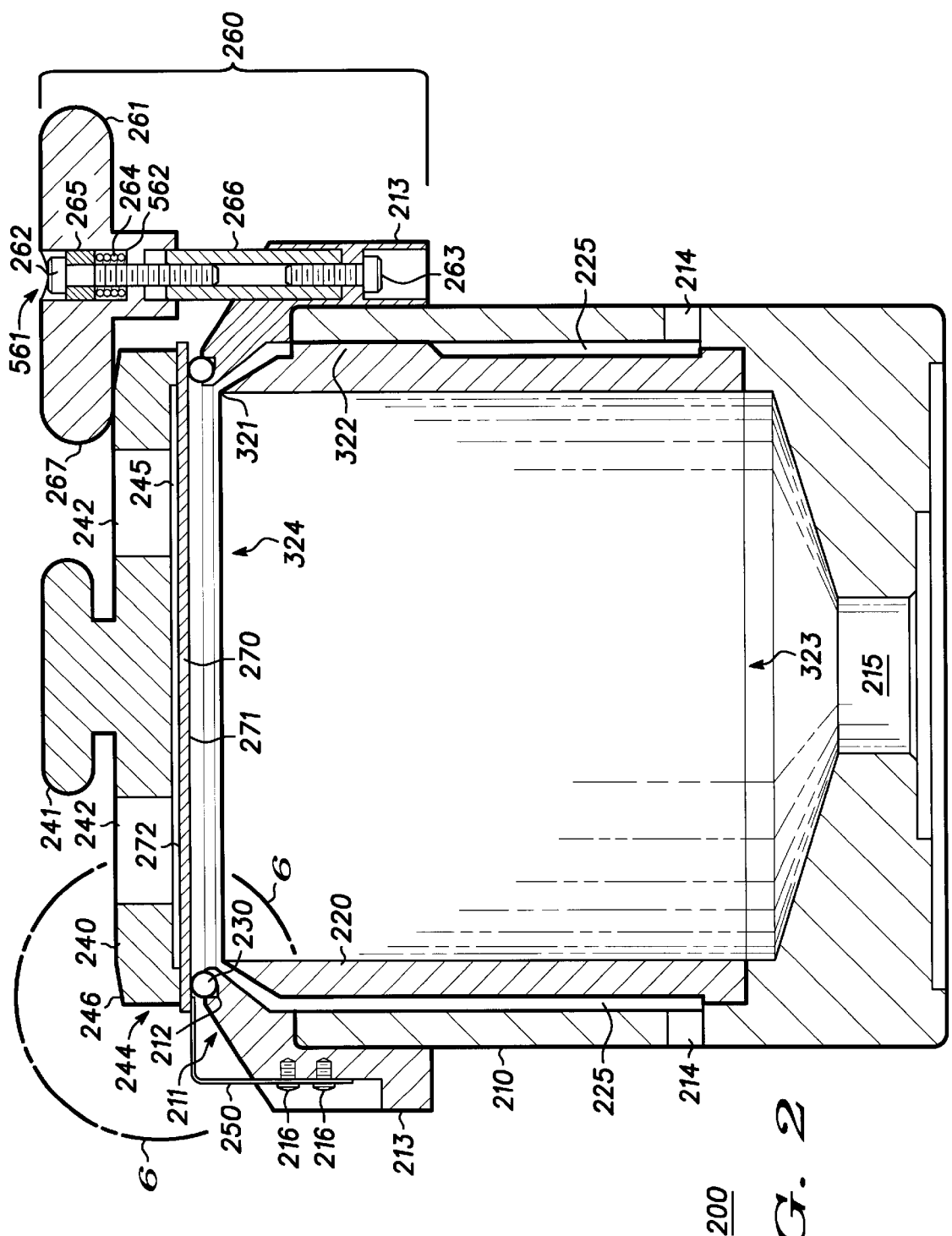
FIG. 2 illustrates a cross-sectional view of an embodiment of a plating tool used to manufacture the semiconductor component in accordance with the present invention.

Turning to FIG. 2, a plating tool 200 used to manufacture a semiconductor component is illustrated in cross-sectional view. Plating tool 200 is used to plate the second metal layer over the semiconductor substrate in step 112 of method 100 in FIG. 1. Plating tool 200 includes an outer weir 210, an inner weir 220 located within outer weir 210, an elastic member 230, a pressure ring 240 located over elastic member 230 and inner and outer weirs 210 and 220, respectively, a cathode connector or contact 250, and a spring-loaded knob lock 260. A substrate 270 having opposite surfaces 271 and 272 is disposed in plating tool 200. Weirs 210 and 220, pressure ring 240, and knob lock 260 are preferably comprised of polypropylene or polyvinyl-difluoride.

Outer weir 210 has a rim 211. Rim 211 includes a groove 212 in which elastic member 230 is located. Weir 210 also includes an input port 215 and a plurality of output ports 214. As explained in more detail hereinafter, a plating solution enters plating tool 200 from port 215 and exits tool 200 from ports 214. Weir 210 also includes a removable ring portion 213. Cathode contact 250 is coupled to portion 213 using fasteners 216. Fasteners 216 and the coupling portion of cathode contact 250 are located within a recess in ring 213. As explained in more detail hereinafter, knob lock 260 is also coupled to ring 213. When plating tool 200 is used to plate 150 millimeter diameter substrates, outer weir 210 preferably has a cylindrical shape with a height of approximately 150 to 200 millimeters and a diameter of approximately 150 mimeters.

Figure 3:
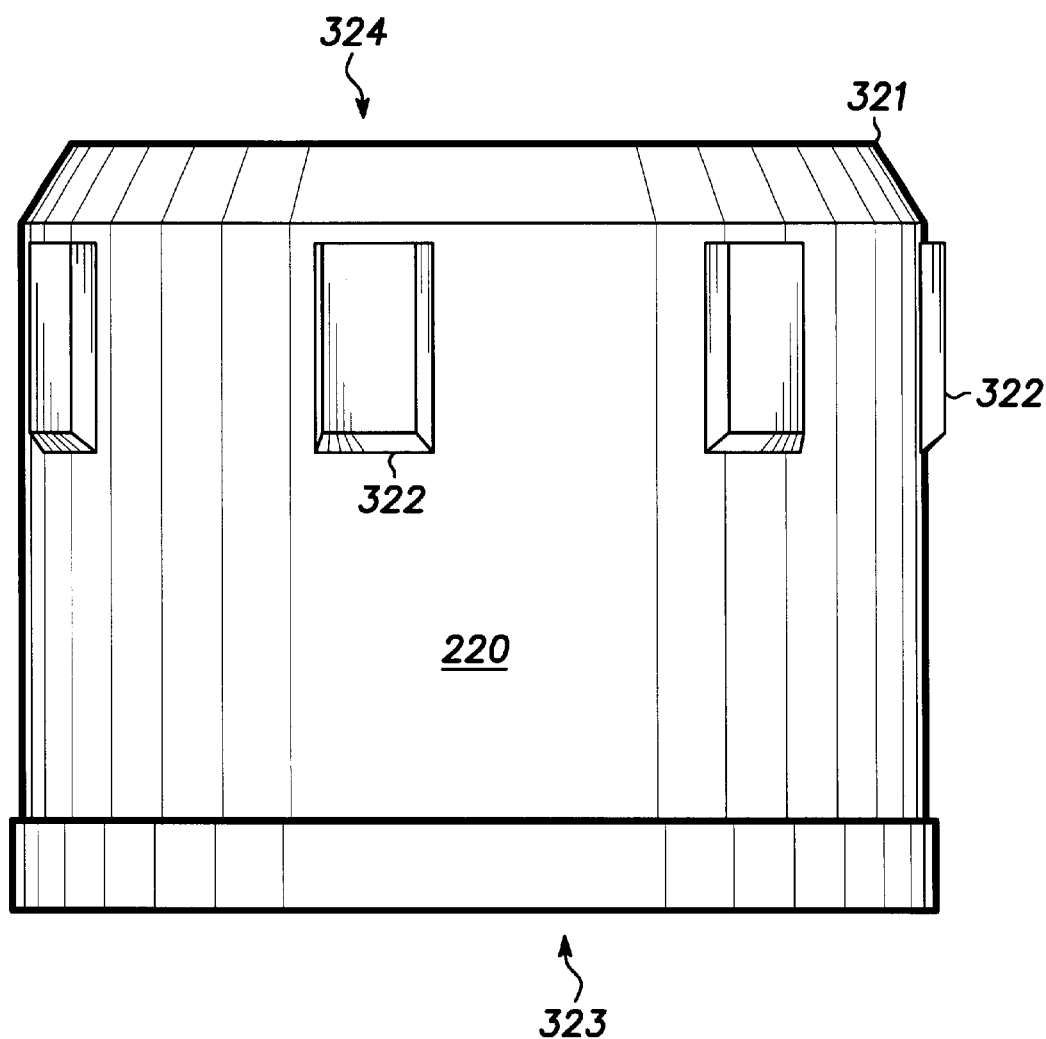
FIG. 3 illustrates a side view of an inner weir of the plating tool of FIG. 2.

FIG. 3 illustrates a side view of inner weir 220. Weir 220 includes a plurality of spacers 322 (only one of which is shown in FIG. 2), a rim 321 defiing an output port 324, and an input port 323. One skilled in the art will understand that an anode for tool 200 is positioned within weir 220. Weir 220 preferably has a cylindrical shape with a height of approximately 100 to 120 millimeters and a diameter of approximately 130 to 140 millimeters. When viewing FIGS. 2 and 3 in combination, one skilled in the art will understand that spacers 322 are used to provide a fixed, constant, or even distance or separation between the outer wall of weir 220 and the inner wall of weir 210. This distance or separation forms a passage or channel 225 (FIG. 2) that is coupled to output ports 214. In the preferred embodiment, spacers 322 are spaced evenly around the circumference of weir 220. As an example, weir 220 can include 6 to 8 spacers.

Returning to FIG. 2, elastic member 230 provides a seal between rim 211 of weir 210 and substrate 270. To provide a reliable seal, elastic member 230 preferably extends above rim 211. In the preferred embodiment, elastic member 230 is comprised of a flexible or resilient material such as, for example, a rubber o-ring.

Also in FIG. 2, pressure ring 240 is located over substrate 270, outer weir 210, and inner weir 220. Pressure ring 240 includes a contact portion 244 located at a perimeter of ring 240. Contact portion 244 applies pressure to or contacts a peripheral portion of surface 272 of substrate 270. Portion 244 is located over rim 211, groove 212, and elastic member 230. The central portion of pressure ring 240 preferably does not contact substrate 270. This configuration of pressure ring 240 reduces the likelihood of fracturing substrate 270 by only applying pressure to substrate 270 at portions of substrate 270 that are supported by elastic member 230.

Ring 240 further includes a beveled edge 246 around a perimeter of ring 240 and a handle portion 241 extending from a top surface of ring 240. Pressure ring 240 also includes a plurality of holes 242 exposing portions of surface 272 of substrate 270. Holes 242 facilitate the removal of substrate 270 from plating tool 200, and in particular, from pressure ring 240. For example, if substrate 270 is stuck to ring 240, a person may insert his or her fingers into holes 242 to release substrate 270 from ring 240.

Cathode contact 250 is located between substrate 270 and rim 211 of outer weir 210. Cathode contact 250 is also located underneath portion 244 of pressure ring 240 and is further located adjacent to elastic member 230. Although FIG. 2 only illustrates a single cathode contact 250, plating tool 200 preferably includes four cathode contacts, as illustrated in FIG. 4.

Figure 4:
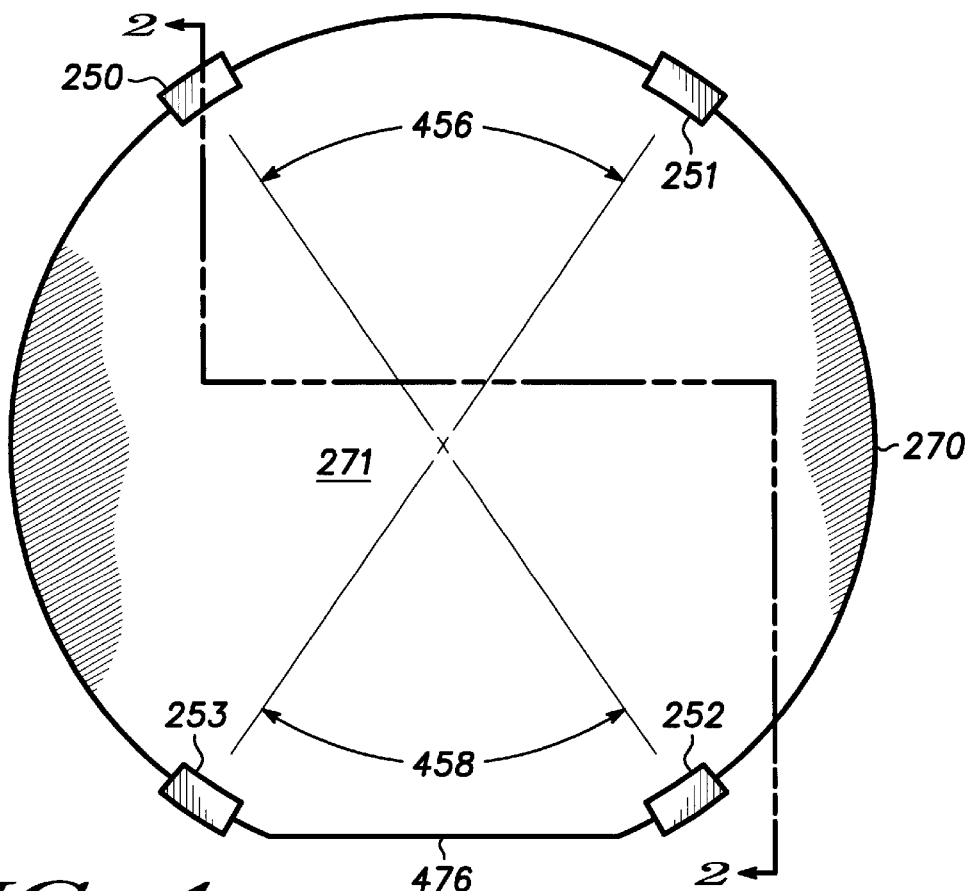
FIG. 4 illustrates an inner view of a portion of the plating tool of FIG. 2.

Turning to FIG. 4, substrate 270 and a plurality of cathode contacts 250, 251, 252, and 253 are illustrated as viewed upward from within outer weir 210 (FIG. 2). The cross-sectional view of FIG. 2 is taken along cross-sectional line 4—4 in FIG. 4. Cathode contacts 250 through 252 represent a configuration of the plurality of cathode contacts in tool 200 of FIG. 2. In FIG. 4, cathode contacts 250 through 253 are located around a perimeter of substrate 270. Cathode contacts 252 and 253 are preferably separated by an angle 458 that is approximately 40 to about 90 degrees. Cathode contacts 250 and 251 are preferably opposite or about 180 degrees apart from cathode contacts 252 and 253, respectively. Accordingly, cathode contacts 250 and 251 are preferably separated by an angle 456 that is approximately the same as angle 458. The configuration of cathode contacts 250 through 253 provides a controlled, predictable, and uniform plating of substrate 270. Additional details of the cathode contacts in plating tool 200 are explained hereinafter.

Returning to FIG. 2, knob lock 260 is adjustably coupled to portion 213 of outer weir 210 in order to apply pressure onto pressure ring 240 and to seal outer weir 210 with elastic member 230 and substrate 270. Knob lock 260 includes, among other features, a handle portion 261 with a curved edge 267, which is slidingly engagable with beveled edge 246 of pressure ring 240. Although a single knob lock 260 is illustrated in FIG. 2, one skilled in the art will understand that tool 200 preferably includes a plurality of knob locks to adequately seal weir 210. In addition to handle portion 261, knob lock 260 also includes two knob screws 262 and 263, a spring 264, a bushing 265, and a fastener 266. Screw 262 is inserted through bushing 265 and spring 264, and screws 262 and 263 are inserted and tightened into fastener 266.

Figure 5:
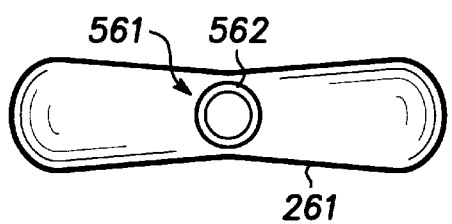
FIG. 5 illustrates a top view of an additional portion of the plating tool of FIG. 2.

FIG. 5 illustrates a top view of handle portion 261. Handle portion 261 includes a hole 561 and a recessed portion 562 (see FIGS. 2 and 5) within hole 561. Spring 264 (FIG. 2), bushing 265 (FIG. 2), and screw 262 (FIG. 2) are located within hole 561 of handle portion 261. Viewing FIGS. 2 and 5 in combination, one skilled in the art will understand that handle portion 261 is twistable to apply pressure to pressure ring 240 and is also twistable to release the pressure from pressure ring 240.

Figure 6:
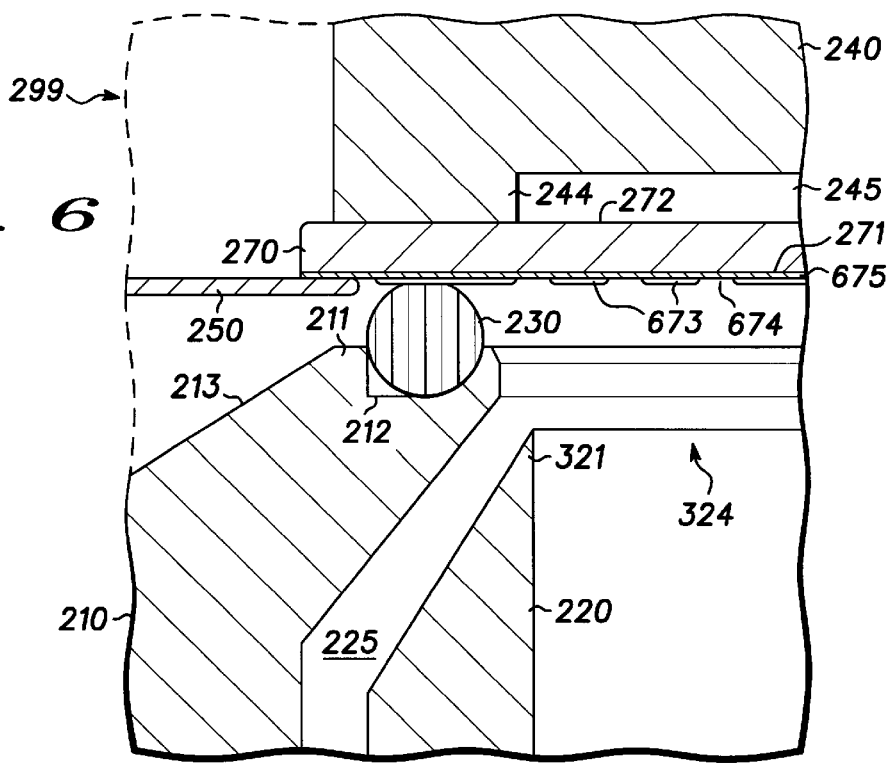
FIGS. 6 and 7 illustrate detailed cross-sectional views of different portions of the plating tool in accordance with the present invention.

Turning to FIG. 6, a detailed cross-sectional view of a portion 299 of plating tool 200 is illustrated. Substrate 270 is positioned between elastic member 230 and pressure ring 240, and substrate 270 is also located over inner weir 220 and outer weir 210. Surface 272 of substrate 270 faces toward pressure ring 240 and away from weirs 210 and 220, and surface 271 of substrate 270 faces into weirs 210 and 220. In the preferred embodiment, substrate 270 includes a semiconductor substrate and can include a plurality of dielectric layers and a plurality of metal layers. A plurality of semiconductor devices are formed in the semiconductor substrate. In the preferred embodiment, the plurality of semiconductor devices form an integrated circuit that is located closer to surface 271 than surface 272. Alternatively, the semiconductor devices can be located closer to surface 272 than surface 271. An electrically conductive layer 675 has been previously deposited over surface 271 of substrate 270. In the preferred embodiment, layer 675 is a metal seed layer. A plating mask 673 is subsequently formed over electrically conductive layer 675. Mask 673 is patterned and contains a plurality of openings to expose portions 674 of layer 675. As explained hereinafter, a second electrically conductive layer is plated onto portions 674 of layer 675. Preferably, mask 673 is located over elastic member 230 and separates elastic member 230 from electrically conductive layer 675. In the preferred embodiment, mask 673 is a patterned photoresist layer.

Cathode contact 250 is located adjacent to surface 271 of substrate 270. Cathode contact 250 is coupled or attached to electrically conductive layer 675, preferably without contacting mask 673. Mask 673 is preferably patterned such that the coupling of cathode contact 250 to electrically conductive layer 675 is performed without puncturing or scraping through mask 673. In this manner, physical contact between cathode contact 250 and mask 673 can be avoided, and a more reliable electrical connection can be formed. Cathode contact 250 remains coupled to electrically conductive layer 675 during the plating of step 112 in FIG. 1.

Figure 7:
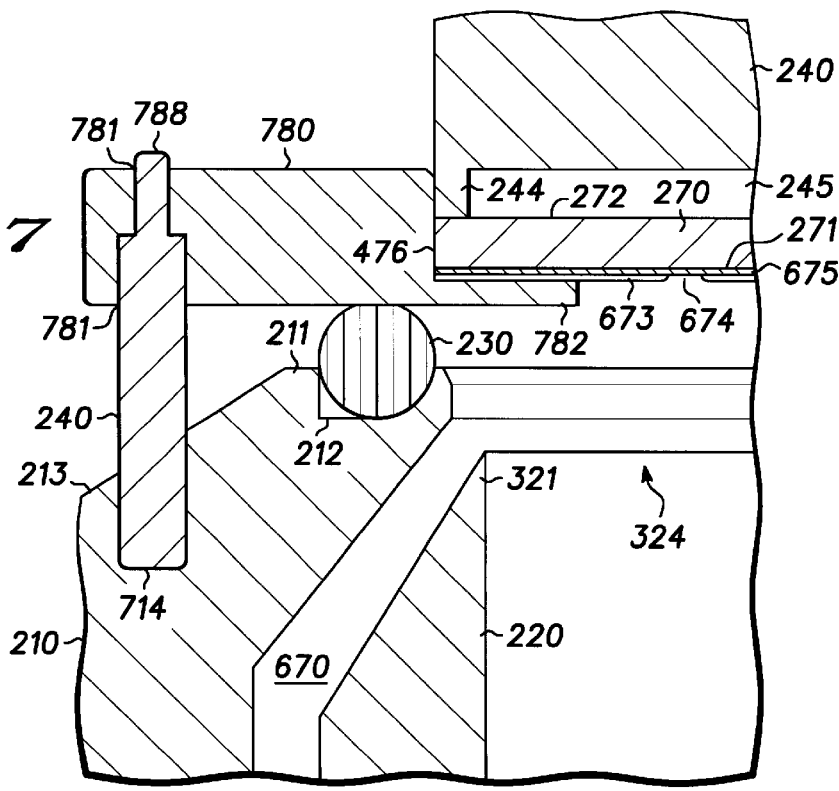

Turning to FIG. 7, a detailed cross-sectional view of a plating tool 200 is illustrated. This portion of tool 200 illustrated in FIG. 7 is not illustrated in FIG. 2. FIG. 7 illustrates a portion of tool 200 adjacent to wafer flat 476 (FIG. 4). FIG. 7 illustrates tool 200 to include a flat adapter 780 that abuts flat 476 of substrate 270. Adapter 780 is used to compensate for the smaller radius or diameter of substrate 270 at flat 476 and to maintain a tight seal over weir 210. Pressure ring 240 is also designed to accommodate flat 476 of substrate 270.

Adapter 780 includes a thin extension 782 for supporting substrate 270 at flat 476. Flat 476 of substrate 270 reduces the radius or diameter of substrate 270 so that substrate 270 does not overlie elastic member 230 at flat 476. Therefore, adapter 780 rests on top of elastic member 230, and extension 782 of adapter 780 supports substrate 270. The combination of adapter 780, substrate 270, and elastic member 230 forms the seal over weir 210 at flat 476.

Adapter 780 also includes a hole 781 in which a pin 788 is located. Portion 213 of weir 210 also includes a hole 714 in which pin 788 is located. Pin 788 aligns adapter 780. In the preferred embodiment, adapter 780 and weir 210 include a plurality of holes 781 and 714, respectively, to permit the use of a plurality of pins 788 to provide proper alignment of adapter 780 and substrate 270.

Returning to FIG. 2, a more detailed explanation of the operation of plating tool 200 is provided. As explained before, substrate 270 is positioned over weirs 210 and 220 such that surface 271 of substrate 270 faces into weirs 210 and 220. An electrically conductive layer covers surface 271 of substrate 270, and a patterned photoresist layer covers the metal layer. The peripheral portion of substrate 270 overlies elastic member 230, and elastic member 230 contacts the photoresist layer and is devoid of directly contacting the electrically conductive layer adjacent to surface 271 of substrate 270. Knob lock 260 applies pressure to pressure ring 240, and pressure ring 240 applies pressure to the peripheral portion of surface 272 of substrate 270, and the peripheral portion of surface 271 of substrate 270 applies pressure to elastic member 230 to seal weir 210.

After plating tool 200 is sealed, a plating solution is pumped into tool 200 through port 215. The plating solution enters inner weir 220 through port 323 and overflows from inner weir 220. As the plating solution overflows, it spills over rim 321 of weir 220 and into channel 225. Also, as the plating solution overflows from weir 220, the plating solution contacts the exposed portions of the electrically conductive layer adjacent to surface 271 of substrate 270, and a second electrically conductive layer is plated onto those exposed portions. As the plating solution travels through channel 225, the plating solution is removed from tool 200 through ports 214. The sealing of tool 200 prevents the plating of surface 272 and the edge surface of substrate 270.

Therefore, an improved method of manufacturing a semiconductor component and plating tool therefor is provided to overcome the disadvantages of the prior art. The plating technique eliminates the undesired plating of the edge and back surfaces of a substrate and also provides adequate control of the plating process. Furthermore, while the present invention has been particularly shown and described with reference to specific embodiments, it will be understood by those skilled in the art that various changes may be made to the embodiments herein without departing from the spirit or scope of the present invention. For instance, the numerous details set forth herein such as, for example, the material compositions and the dimensions are provided to facilitate the understanding of the present invention and are not provided to limit the scope of the present invention.

The disclosure of the embodiments of the present invention is intended to be illustrative of the scope of the present invention and is not intended to be limiting. It is intended that the scope of the present invention shall be limited only to the extent required by the appended claims and the rules and principles of applicable law. The appended claims are not to be interpreted as including means-plus-function limitations, unless such a limitation is expressly recited in a given claim using the phrase "means for".

What is claimed is:

1. A method of manufacturing a semiconductor component comprising:
    depositing a first electrically conductive layer over a first surface of a substrate;
    forming a plating mask over the first electrically conductive layer, the plating mask having a hole exposing a portion of the first electrically conductive layer;
    coupling a first plating electrode to the first electrically conductive layer without puncturing the plating mask and preventing the first plating electrode from contacting the plating mask; and
    plating a second electrically conductive layer onto the portion of the first electrically conductive layer.

2. The method of claim 1 further comprising:
    preventing the plating of the second electrically conductive layer over second and edge surfaces of the substrate, wherein:
        the second surface is opposite the first surface; and
        the edge surface is located between the first and second surfaces.

3. The method of claim 1 wherein:
    the plating step further comprises plating the second electrically conductive layer only onto the portion of the first electrically conductive layer.

4. The method of claim 1 further comprising:
    using the substrate to seal an outer weir of a plating tool.

5. The method of claim 4 further comprising:
    providing an inner weir for the plating tool, the inner weir located inside the outer weir;
    pumping a plating solution into the inner weir, to overflow from the inner weir, to contact the portion of the first electrically conductive layer, and to flow into the outer weir; and
    removing the plating solution from the outer weir.

6. The method of claim 4 further comprising:
    using an elastic member to seal the outer weir, the elastic member located between the substrate and the outer weir.

7. The method of claim 6 further comprising:
    providing a rubber o-ring for the elastic member.

8. The method of claim 6 further comprising:
    applying pressure to a peripheral portion of a second surface of the substrate to seal the outer weir; and
    keeping the pressure away from a central portion of the second surface of the substrate, wherein:

the second surface is located opposite the first surface;

the peripheral portion of the second surface is located over the elastic member; and the peripheral portion of the second surface of the substrate surrounds the central portion of the second surface of the substrate.

9. The method of claim 1 further comprising:

using a closed plating system to plate the second electrically conductive layer.

10. The method of claim 1 further comprising:

physically and electrically coupling a second plating electrode to the first electrically conductive layer without puncturing the plating mask, wherein:

the first and second plating electrodes are located approximately 40 to 90 degrees apart.

11. The method of claim 10 further comprising:

physically and electrically coupling third and fourth plating electrodes to the first electrically conductive layer without puncturing the plating mask, wherein:

the third and fourth plating electrodes are located approximately 40 to 90 degrees apart;

the first and third plating electrodes are located approximately 180 degrees apart; and the second and fourth plating electrodes are located approximately 180 degrees apart.

\* \* \* \* \*